(12) United States Patent
Tsukada

(10) Patent No.: US 7,106,641 B2
(45) Date of Patent: Sep. 12, 2006

(54) DYNAMIC SEMICONDUCTOR MEMORY DEVICE

(75) Inventor: Shuichi Tsukada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 8 days.

(21) Appl. No.: 11/064,837

(22) Filed: Feb. 25, 2005

(65) Prior Publication Data

US 2005/0190591 A1 Sep. 1, 2005

(30) Foreign Application Priority Data

Feb. 27, 2004 (JP) ............................. 2004-052813

(51) Int. Cl.
*G11C 29/30* (2006.01)
(52) U.S. Cl. ...................... 365/200; 365/207
(58) Field of Classification Search ................ 365/200, 365/203, 205, 207, 208
See application file for complete search history.

(56) References Cited

U.S. PATENT DOCUMENTS

| | | | |
|---|---|---|---|
| 5,499,211 A | 3/1996 | Kirihata et al. | |
| 5,594,701 A | 1/1997 | Asaka et al. | |
| 5,689,469 A | 11/1997 | Asaka | |
| 5,748,520 A | 5/1998 | Asaka et al. | |
| 5,896,336 A * | 4/1999 | McClure ...................... 365/205 |
| 6,882,591 B1 * | 4/2005 | Winograd et al. ..... 365/230.03 |

FOREIGN PATENT DOCUMENTS

JP  7-334987  12/1995
JP  8-263983  10/1996

OTHER PUBLICATIONS

T. Kirihata et al., "Fault-Tolerant Designs for 256 Mb DRAM," IEEE Journal of Solid-State Circuits, vol. 31:4, Apr. 1996, pp. 558-566.

* cited by examiner

*Primary Examiner*—Vu A. Le
(74) *Attorney, Agent, or Firm*—Foley & Lardner LLP

(57) ABSTRACT

To provide a dynamic semiconductor memory device wherein it is possible to perform a reliable redundancy relief with a small layout area and high redundancy relieving rate while properly dealing with the standby current fault caused by a short-circuit defect between a bit line and word line. A common current-limiting element is provided for an equalizer circuit for a bit line pair on one side and another equalizer circuit for another bit line pair on the other side in a shared sense amplifier, and a bit line precharge potential is supplied to the equalizer circuits on the both sides through the current-limiting element.

21 Claims, 12 Drawing Sheets

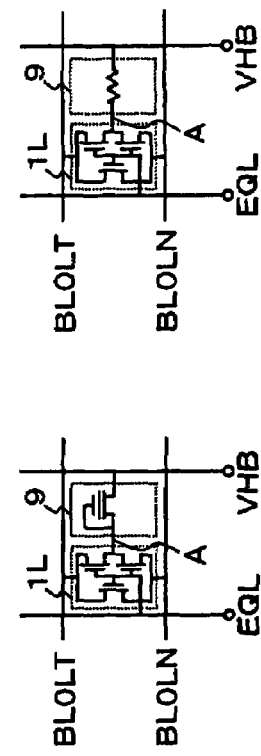
FIG. 10A PRIOR ART
FIG. 10B PRIOR ART
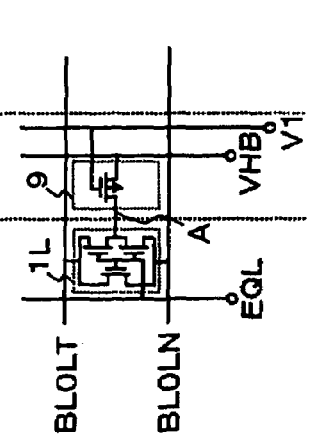
FIG. 10C PRIOR ART
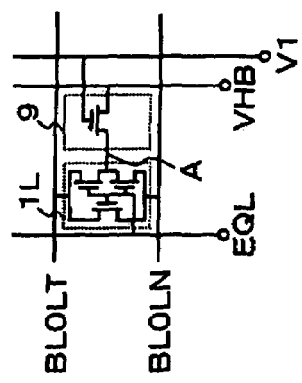
FIG. 10D PRIOR ART

DYNAMIC SEMICONDUCTOR MEMORY DEVICE

FIELD OF THE INVENTION

The present invention relates to a dynamic semiconductor memory device (DRAM), and especially to a circuit that suppresses the increase in leakage current caused by a short-circuit defect between a bit line and word line at the time of standby.

BACKGROUND OF THE INVENTION

In a conventional DRAM, redundant cells are provided in order to improve manufacturing yield, therefore, even when a defect occurs in a part of normal memory cells, by relieving and replacing the defective cells with redundant cells, the device can be made non-defective. The replacement with redundant cells is performed by programming such as cutting the fuses according to the addresses with a write/read fault during a preliminary test in the wafer state. First, a typical example of an array configuration of a DRAM with the function of replacing a defective cell with a redundant cell is explained with reference to FIG. 1. FIG. 1 shows an overall array configuration of an embodiment where the present invention is applied, however, this will be explained first for the understanding of the invention technology.

In reference to FIG. 1, memory plates 7 are composed of a memory cell group N7, which is a group of normal cells, and an R memory cell group R7, which is a group of column redundancy cells, and provided plurally, arranged in a matrix form of row number 0 through M and column number 0 through N. The memory plates 7 and word line drivers (sub-word line drivers) SWD 12 are provided alternately in the column direction.

Sense amplifiers 6 are composed of SAN 6, which are sense amplifiers controlling the memory cell group N7, and SAR 6, which are sense amplifiers for the column redundant cells, controlling the R memory cell group R7.

The memory plates 7 and sense amplifiers 6 are provided alternately in the row direction. A sense amplifier sandwiched by the memory plates 7, for example the sense amplifier 6, which is sandwiched by the memory plates 7 on row number 0 and row number 1 in FIG. 1, controls both of the memory plates, the one on row number 0 (on the left side in FIG. 1) and one on row number 1 (on the right side in the drawing).

Such a sense amplifier configuration that controls the memory plates on both left and right sides is called shared sense amplifier.

Further, X decoders XDEC 14 are provided below the array configuration in FIG. 1, and Y decoders YDEC 13 are provided on the left side of the array configuration. The YDEC 13 comprises a YDEC N13 that outputs multiple row selecting signal lines YSW 0, YSW 1, etc. controlling a sense amplifier N 6 for the normal cells, and a RYDEC R13 that outputs a row selecting signal line RYSW controlling a sense amplifier R6 for the column redundancy cells.

In FIG. 1, only the row selecting signal lines YSW0, YSW1, etc and the RYSW on row number 0 are shown, however, these are similarly provided in row numbers 1 through N as well. Also, in the array configuration example shown in FIG. 1, only a column redundancy architecture that performs the replacement in the column direction is shown, however, a row redundancy architecture that performs the replacement in the row direction is also provided in a conventional configuration.

FIG. 6 is a drawing showing an example of a conventional circuit configuration of the shared sense amplifiers sandwiched by 2 memory plates 7 out of the sense amplifiers 6 shown in FIG. 1.

In reference to FIG. 6, to the left of a shared sense amplifier 60 (which corresponds to 6 in FIG. 1), a memory cell group N7L, a group of normal cells, and an R memory cell group R7L, a group of column redundancy cells, are provided and to the right, a memory cell group N7R, a group of normal cells, and an R memory cell group R7R, a group of column redundancy cells, are provided.

In the memory cell group N7L, multiple bit lines such as a pair of bit lines BL0LT and BL0LN, and another pair of bit lines BL1LT and BL1LN are provided, and multiple memory cells 8 are connected to each bit line. The memory cell group N7R, memory cell group R7L, and R7R have the same configuration.

The memory cell 8 is comprised of a cell capacitor and cell transistor formed with NMOS transistors. One side electrode of the cell capacitor is connected to a capacitor plate to which a voltage VP is supplied, and the other side electrode of the cell capacitor is connected to one of electrodes of the cell transistor. Furthermore, the other electrode of the cell transistor is connected to a bit line and the gate is connected to a word line.

A sense amplifier circuit 60 comprises equalizer circuits 1L and 1R on its left and right, shared switches 2L and 2R, an NMOS sense circuit 3, a PMOS sense circuit 4, and an IO switch 5, and controls the two bit line pairs, the bit line pair BL0LT and BL0LN on the left and the bit line pair BL0RT and BL0RN on the right. Sense amplifier circuits 61, 62, 63, . . . and R60, R61 have the same circuit configuration.

The equalizer circuit 1L comprises three NMOS transistors: an NMOS transistor whose electrode (either the source or drain electrode) is connected to the bit line BL0LT and other electrode (either the source or drain electrode) is connected to the bit line BL0LN, an NMOS transistor whose electrode is connected to the bit lineBL0LT and other electrode is connected to a bit line precharge power supply VHB, and an NMOS transistor whose electrode is connected to the bit line BL0LN and other electrode is connected to the a bit line precharge power supply VHB, and, to the gates of these three NMOS transistors, a control signal EQL is connected in common. When the control signal EQL is brought to a high level, the NMOS transistors of the equalizer circuit 1L are turned on and the bit lines BL0LT and BL0LN are precharged to the precharge power supply VHB. Like the equalizer circuit 1L, the equalizer circuit 1R comprises three NMOS transistors and a control signal EQR is connected in common to the gates of the three NMOS transistors.

The shared switch 2L comprises two NMOS transistors: an NMOS transistor whose electrode is connected to the bit line BL0LT and other electrode is connected to a sense amplifier circuit node SL0T, and an NMOS transistor whose electrode is connected to the bit line BL0LN and other electrode is connected to a sense amplifier circuit node SL0N, and a control signal SHL is connected in common to the gates of these two NMOS transistors. A shared switch 2R on the right has the same circuit configuration and a control signal SHR is connected in common to the gates of its two NMOS transistors. When each of the control signals SHL and SHR is brought to a high level, each of the shared switches 2L and 2R is turned on, the bit line pair BL0LT and BL0LN on the left and the bit line pair BL0RT and BL0RN on the right become electrically connected to the sense circuits (the NMOS sense circuit 3 and PMOS sense circuit 4).

The NMOS sense circuit 3 comprises two NMOS transistors: an NMOS transistor whose electrode is connected to the sense amplifier circuit node SL0T, other electrode is connected to a sense signal SAN and gate is connected to the sense amplifier circuit node SL0N, and an NMOS transistor whose electrode is connected to the SL0N, other electrode is connected to the SAN and gate is connected to the SL0T.

The PMOS sense circuit 4 comprises two PMOS transistors: an PMOS transistor whose electrode is connected to the sense amplifier circuit node SL0T, other electrode is connected to a sense signal SAP and gate is connected to the sense amplifier circuit node SL0N, and an PMOS transistor whose electrode is connected to the node SL0N, other electrode is connected to the SAP and gate is connected to the SL0T.

The IO switch 5 comprises two NMOS transistors: an NMOS transistor whose electrode is connected to the SL0T, other electrode is connected to one of multiple IO lines and gate is connected to the row selecting signal line YSW0, and an NMOS transistor whose electrode is connected to the SL0N, other electrode is connected to another line of the multiple IO lines and gate is connected to the row selecting signal line YSW0.

In the configuration shown in FIG. 6, one row selecting signal line controls two sense amplifier circuits. In other words, the row selecting signal line YSW0 is inputted into the sense amplifier circuit 60 and a sense amplifier circuit 61, and into the gates of 4 NMOS transistors within the IO switch circuit. In this case, four IO lines are provided, and the other electrodes of the four NMOS transistors, which constitute the IO switch circuit and have the common row selecting signal line connected to its gates, are connected to separate IO lines.

With this example of a circuit configuration, when the row selecting signal line YSW0 is activated according to the address inputted externally, two sense amplifier circuits, the sense amplifier circuit 60 and sense amplifier circuit 61, can be written or read simultaneously.

As another example, there is a case where one row selecting signal line is inputted into one sense amplifier circuit. In this case, two IO lines are provided and by activating one row selecting signal line, the write or read operation of one sense amplifier circuit will start.

As a further example, there is a case where one row selecting signal line is inputted into four sense amplifier circuits, and in this case, eight IO lines are provided, and by activating one row selecting signal line, four sense amplifier circuits can be written or read simultaneously.

When a write/read fault occurs in a cell within the memory cell group N7L, which is a normal cell group on the left of the sense amplifier shown in FIG. 6, it is replaced with a redundant cell. For example, if a write/read fault occurs in a memory cell connected to the bit line BL0LN, a memory cell group 10 connected to 2 pairs of bit lines BL0LT, BL0LN and BL1LT, BL1LN, a total of four bit lines, is replaced with the column redundancy cell group R7L as a set.

In other words, a memory cell group controlled commonly by the row selecting signal line YSW0 and within the memory cell group N7L is replaced as a set. It is because of the necessity to replace sense amplifier circuits, which is written or read by one selecting signal line, as a set.

In the case where one row selecting signal line is inputted into one sense amplifier circuit, a pair of bit lines is replaced as a set.

Furthermore, in the case where one row selecting signal line is inputted into four sense amplifier circuits, eight bit lines are replaced as a set.

Furthermore, only one row selecting signal line RYSW for the column redundancy cells is shown in FIGS. 1 and 6, however, there is a case where multiple row selecting signal lines for the column redundancy cells are provided so that multiple faults can be relieved.

The shared sense amplifier shown in FIG. 6 is constituted such that the memory cell group 10, which corresponds to the row selecting signal line YSW0, is replaced by the column redundancy cells R7L of the row selecting signal line RYSW on the left side, and a memory cell group 11, which corresponds to the row selecting signal line YSW1, is replaced by the column redundancy cells R7R on the right side. In other words, this is a method in which a memory plate on one side of the shared sense amplifier and one on the other side are divided into different column replacement segments. In the present description, "column replacement segment" is a unit of memory cell group with the same group to replace in the column redundancy.

With a small layout area of column redundancy cells, the can be improved by having separate column replacement segments rather than having a common column replacement segment for the both sides of the shared sense amplifier.

In FIG. 1, let's assume that there are L number of the row selecting signal lines RYSW for the column redundancy cells on column number 0. If the left and right sides of all shared sense amplifiers have one common column replacement segment, the big region covered by M+1 number of memory cell groups, which corresponds to column number 0 and row numbers 0 through M, becomes one column replacement segment. In this case, up to L number of faults within this big region of column replacement segment can be relieved, however, if L+1 number of faults occur, it cannot be relieved.

In order to relieve L+1 number of faults, L+1 number of the row selecting signal lines RYSW for the column redundancy cells of column number 0 are needed, and as a result, the layout area of the column redundancy cells will increase.

On the other hand, in the case where the left and right sides of all shared sense amplifiers have separate column replacement segments, each memory cell group N7 on column number 0, but a different row number, becomes a small separate column replacement segment. In this case, up to L number of faults within the each small column replacement segment can be relieved.

Therefore, if the same amount of faults occur in each of the column replacement segments, a maximum of L×(M+1) number of faults can be relieved within the big region covered by M+1 number of memory cell groups that correspond to column number 0 and row numbers 0 through M.

As described above, with the same amount of the row selecting signal lines for the column redundancy cells, the smaller the column replacement segment, the more faults can be relieved.

Further, when trying to relieve the same fault density, the smaller the column replacement segment, the fewer row selecting signal lines for the column redundancy cells is needed, and as a result, a small layout area of the column redundancy cells can be achieved.

Also, not all shared sense amplifiers have memory cell groups on the both sides assigned to different column replacement segments. In general, a configuration where several memory cell groups are assigned to one column replacement segment is commonly used.

For example, in FIG. 1, the two memory cell groups on column number 0 and row numbers 0 and 1 are assigned to one column replacement segment, and the memory cell groups on row numbers 2 and 3 are assigned to one column replacement segment. This means every two memory cell groups are assigned to one column replacement segment. This is because of the following problem: The smaller column replacement segment results in more sets of the column replacement. It means more fuses for programming are needed, and as a result, the layout area of the fuses increases.

In FIG. 6, the PMOS sense circuit 4 is provided in an N-well region. All the circuits shown in FIG. 6, except for the PMOS sense circuit 4, are provided in a P-well region. On the borderline between the N-well and P-well, an wasted region with a width of several um (micrometers) called "well isolation area" where no transistor can be provided occurs. Therefore, in order to decrease the layout area, all the N-well regions of the PMOS sense circuits 4 within the sense amplifier circuits 60, 61, 62, 63, . . . , and R60 and R61 are connected, and the N-well regions are provided zonally in the vertical direction of the drawing.

FIG. 7 is a timing chart showing an example of the general operation of the shared sense amplifier shown in FIG. 6. As power-supply voltages, a boost level VPP, an array voltage VAR, the bit line precharge power supply VHB, and a reference voltage GND are supplied. The level of the VHB is set to the level of ½×VAR level. Further, the level of a capacitor plate voltage VP supplied in FIG. 6 is generally the same fixed level as the VHB.

Also, in the example shown in FIG. 7, the level of the word line during the equalizing period is at the GND potential, however, with recent DRAM's, there are cases where a power supply VKK with a negative potential, lower than the GND potential, is provided, and the level of the word line during the equalizing period is set to the VKK. Further, in a conventional DRAM, a negative potential VBB, lower than the GND potential, is supplied as the potential of the P-well shown in FIG. 6.

During the equalizing period before timing T1, the control signals EQL and EQR is set to the VPP level (the EQR is shown in the drawing). Because of this, the equalizer circuits 1L and 1R are turned on, a short circuit between the pairs of the bit line pair BL0LT, BL0LN and bit line pair BL0RT, BL0RN occurs (an equalizing operation is performed), and the bit line precharge power supply VHB is supplied. The control signals SHL and SHR are set to the VPP level, and the shared switch circuits 2L and 2R are turned on. Because of this, the sense amplifier circuit nodes SL0T, SL0N etc. are set to the VHB level, the same level as the bit line pair BL0LT, BL0LN and bit line pair BL0RT, BL0RN.

Let's assume that the word line within the memory cell group N7L on the left of FIG. 6 is activated at the timing of T1. In this case, the control signal SHR is set to the GND level, and the sense amplifier circuit nodes SL0T and SL0N, and the bit lines BL0RT and BL0RN are disconnected respectively. Also, the control signal EQL is set to the GND level, the equalizer circuit 1L is turned off, and the equalizing operation of the bit line pair BL0LT, BL0LN is stopped.

The control signal EQR is always kept at the VPP level during the period shown in FIG. 7, and it continues to supply the VHB level to the bit line pairs BL0RT, BL0RN, etc. The control signal SHL (not shown in the drawing) is also always kept at the VPP level during the period shown in FIG. 7, and it keeps the bit lines BL0RT and BL0RN, and the sense amplifier circuit nodes SL0T and SL0N connected electrically.

Next, the electric charge of the cell capacitor of the memory cells 8 connected to a word line, which has been elevated to the VPP level and within the memory cell group N7L, is outputted to the bit line BL0LT or BL0LN. In the example shown in FIG. 7, a high level is outputted to the bit line BL0LT, and this output is transferred to the sense amplifier circuit nodes SL0T and SL0N through the shared switch circuit 2L, and there is a slight difference potential between the SL0T and SL0N. After this, a sense operation is performed, setting the sense signal SAN at the GND level and the sense signal SAP at the VAR level.

During the sense operation, each one of the two transistors of the NMOS sense circuit 3 and PMOS sense circuit 4 corresponds to the slight difference potential between the SL0T and SL0N, and is turned on to amplify this difference potential. The SL0T is sensed at the VAR level and the SL0N at the GND level.

Since the NMOS sense circuit 3 and PMOS sense circuit 4 are designed such that they amplify the slight difference potential normally when the levels of the SL0T and SL0N are close to the VHB level, they cannot amplify normally when the levels of the SL0T and SL0N are not close to the VHB for some reason.

Furthermore, the levels of the nodes SL0T and SL0N within the sense amplifier circuits are transferred to the bit lines BL0LT and BL0LN respectively through the shared switch circuit 2L, and the bit lines BL0LT is set to the VAR level and the BL0LN at the GND level.

Furthermore, although not shown in the drawing, if the level of the row selecting signal line YSW0 is increased from the GND to the VAR level when in the state described above, an IO switch circuit 5 is turned on, and the IO line and the sense amplifier circuit nodes SL0T and SL0N are electrically connected. Because of this, the sense amplifier circuit can be written or read through the IO line, and a write/read operation is performed on the memory cells 8 connected to a selected word line.

The equalizing operation is performed as follows: first, the word line is set to the GND level. Then, by setting the control signal EQL at the VPP level at the timing of T2, the equalizer circuit 1L is turned on and the bit line pair BL0LT, BL0LN is equalized to the VHB level.

During this equalizing operation, even if the bit line precharge power supply VHB hardly supplies any level, the bit line pair BL0LT, BL0LN can be equalized to the VHB level. While being active, the BL0LT is at the VAR level and the BL0LN at the GND level, and the BL0LT and BL0LN have nearly the same wiring capacitance. Therefore, during the equalizing operation, they can be set to the level of ½×the VAR level, i.e., the VHB level by a charge reallocation of each bit line.

Also, the control signal SHR is set to the VPP level around the timing of T2, and the shared switch circuit 2L, 2R is turned on. By doing this, the nodes SL0T and SL0N within the sense amplifier circuit are connected to the bit line BL0LT, BL0LN, and BL0RT, BL0RN respectively through the shared switch circuit 2L and 2R, and as a result, they are set to the VHB level. Since the wiring capacities of the sense amplifier circuit nodes SL0T and SL0N are small, the nodes SL0T and SL0N follow the potential change of the bit lines BL0LT, BL0LN, and BL0RT at a high speed, and reach the VHB level even if the on-resistance of the shared switch circuits 2L and 2R is high.

The period between the timing of T1, when the control signal EQL is set to the GND level, and the timing of T2, when it is set to the VPP level, is an active period, and the period during which the control signal EQL is set to the VPP level is an equalizing period. Further, a case where all the sense amplifiers within the DRAM are in the equalizing period is called "standby."

In the recent DRAM specifications, there has been the stronger demand for an increase in speed by shortening the equalizing period. Therefore, after the control signals EQL and SHR reaches the VPP level, it is preferred that the bit lines BL0LT and BL0LN, and the sense amplifier circuit nodes SL0T and SL0N reach the VHB level sooner than later.

In the circuit configuration shown in FIG. 6, for the purpose of decreasing the layout area of the sense amplifier circuit, it is possible to have a circuit configuration where there is only one equalizer circuit, instead of having the two equalizer circuits (1L and 1R), connected to the sense amplifier circuit nodes SL0T and SL0N.

FIG. 8 is a drawing showing a circuit configuration of such a shared sense amplifier. Only the part controlled by the row selecting signal line YSW0 is extracted from the configuration shown in FIG. 6, and shown in FIG. 8.

The difference between the configurations shown in FIGS. 6 and 8 is the fact that the equalizer circuits 1L and 1R in FIG. 6 are omitted in FIG. 8 and an equalizer circuit 1 is provided instead.

The equalizer circuit 1 comprises an NMOS transistor whose electrode is connected to the sense amplifier circuit node SL0T and other electrode is connected to the SL0N, an NMOS transistor whose electrode is connected to the sense amplifier circuit node SL0T and other electrode is connected to the VHB, and an NMOS transistor whose electrode is connected to the VHB and other electrode is connected to the sense amplifier circuit node SL0N, and a control signal EQ is connected to the gates of these three NMOS transistors.

The operation of the configuration in FIG. 8 is the same as the one in FIG. 7 except for the fact that the control signal EQL is replaced by the control signal EQ. The equalizing operation is performed when the control signal EQ reaches the VPP level at the timing of T2 and the equalizer circuit 1 is turned on. At that time, the short circuit between the bit lines BL0LT and BL0LN occurs through the shared switch circuit 2L and the equalizer circuit 1. The wiring capacities of the bit lines BL0LT, BL0LN, etc. are several times the amount of the wiring capacities of the sense amplifier circuit nodes SL0T, SL0N, etc. Therefore, the on-resistance of the shared switch circuit 2L needs to be low enough in order to have the bit line pairs BL0LT, BL0LN equalized at a high speed and reach the VHB level.

In other words, the transistor size of the shared switch circuit needs to be enlarged. As a result, in order to deal with the demand for speeding up the equalizing period, the layout area of the configuration shown in FIG. 8 ends up bigger than the one of the configuration shown in FIG. 6.

Further, in the configuration shown in FIG. 8, since the shared switch circuit 2R is turned off during the active period, the bit lines BL0RT, BL0RN, etc. are floated. Depending on the specifications of the DRAM, there are cases where the active period becomes very long. If a fault where a minute leakage current flows in the bit lines BL0RT or BL0RN occurs at this time, the level will greatly deviate from the VHB and the bit line will have a write/read fault. Therefore, with the configuration shown in FIG. 8, the manufacturing yield will be reduced compared to the circuit configuration shown in FIG. 6.

Because of the problem described above, the equalizer circuits of the recent DRAM's should be provided discretely for the bit line pairs on the left and right sides of the shared sense amplifier as in the example shown in FIG. 6.

In the configuration of a conventional DRAM shown in FIG. 6, if a short-circuit defect between a bit line and word line occurs, it will result in a write/read fault. For example, if a short-circuit defect 15 between the bit line BL0LT and the word line occurs in FIG. 6, memory cells connected to the bit line pair BL0LN, BL0LT will have a write/read fault.

When this fault occurs, the memory cell group 10 will be replaced by the column redundancy memory cell group R7L and made non-defective in terms of write/read operation.

However, even after the replacement, since the VHB level is supplied to the bit line BL0LT and the GND level (or the VKK level) is supplied to the word line during the equalizing period, a leakage current will flow and the standby current will increase.

Further, the resistance value of the short-circuit defect can be anywhere from a low resistance of several ohms to high resistance of more than several hundreds mOhms. According to our estimate, when a short-circuit defect between a bit line and word line has a low resistance of several ohms, a leakage current at a short-circuit defect area will be approximately 200 µA (microampere).

Since the standby current specification of a conventional DRAM is as small as several mA (milliampere), just by having 10 short-circuit defects with a low resistance between a bit line and word line, it becomes a leakage current fault, resulting in a manufacturing yield reduction.

Therefore, means for reducing leakage current even when a short-circuit defect occurs between a bit line and word line is desired, and several methods have been proposed.

As means for reducing the leakage current caused by a short-circuit defect between a bit line and word line, a method of providing a current-limiting element between a equalizer circuit and bit line precharge power supply VHB is published in Patent Document 1.

FIG. 9 is a drawing showing the configuration of the shared sense amplifier circuit described in Patent Document 1. In FIG. 9, only the part controlled by the row selecting signal line YSW0 is extracted from FIG. 6. The difference between FIG. 6 and FIG. 9 is the fact that the current-limiting elements 9 are provided between the equalizer circuits 1L and 1R and the VHBs in FIG. 9.

Furthermore, as concrete circuit configuration examples, the configurations shown in FIG. 10A, FIG. 10B, FIG. 10C, and FIG. 10D are published in Patent Document 1.

In the circuit configuration shown in FIG. 10A, an NMOS transistor is used as a current-limiting element 9, and one electrode of the NMOS transistor is connected to the VHB, and the other electrode is connected to a node A. Further, its gate is connected to a constant voltage level V1, and the voltage of the V1 is set to a level with which an appropriate current can be flowed. Also, the node A is supplied to the equalizer circuit 1L.

In the circuit configuration shown in FIG. 10B, a PMOS transistor is used as a current-limiting element 9. A gate voltage V1 of the PMOS transistor is set to a level with which a proper current can be flowed.

In the circuit configuration shown in FIG. 10C, a depression-type NMOS transistor is used as a current-limiting element 9. The gate of the depression-type NMOS transistor is connected to the node A. The threshold voltage of the depression-type NMOS transistor is set to a value with which a proper current can be flowed by adjusting the impurity doping level.

In the circuit configuration shown in FIG. 10D, a register is used as a current-limiting element 9. The resistance value of the register is set to a value with which a proper current can be flowed.

Furthermore, in Patent Document 2 and Non-Patent Document 1, a configuration where one current-limiting element is shared by multiple equalizer circuits controlling multiple bit line pairs, which are to be replaced by a column redundancy memory cell group simultaneously as a set is published. By doing so, the number of the current-limiting elements can be reduced and the increase in layout area can be restrained.

FIG. 11 is a drawing showing the circuit configuration of a shared sense amplifier based on such a principle published in Non-Patent Document 1 as FIG. 8.

The differences between FIGS. 11 and 6 are the facts that one current limiting element 9 is provided for two equalizer circuits 1L respectively connected to the bit line pair BL0LT, BL0LN and bit line pair BL1LT, BL1LN, which are to be replaced by a column redundancy memory cell group as a set, one electrode of the current-limiting element 9 is connected to the bit line precharge power supply VHB while the other electrode is connected to a node A0L, and the node A0L is supplied to the two equalizer circuit 1L.

Similarly, one current-limiting element 9 is shared by two equalizer circuits 1R connected to 2 bit line pairs, which are to be replaced by a column redundancy memory cell group as another set. The same goes for the areas controlled by the column redundancy row selecting signal line RYSW. In the example of Non-Patent Document 1, a depression-type NMOS transistor is used as a current-limiting element 9, however, it is possible to use it as a different type of current-limiting element.

FIG. 12A shows the means for reducing the leakage current caused by a short-circuit defect between a bit line and word line, published in Patent Document 2, and the drawing shows only the part on column number 0 extracted from the DRAM array configuration shown in FIG. 1. Furthermore, FIG. 12B is an example of a circuit configuration where this method is applied to a shared sense amplifier circuit, and only the part controlled by the row selecting signal line YSW0 is extracted from FIG. 6.

What is different about FIG. 12A from FIG. 1 is the fact that signal lines A0, A1, . . . RA are wired so that each of them is parallel to each of row selecting signal lines YSW0, YSW1, . . . RYSW, each of the signal lines A0, A1, . . . RA is connected to each of the sense amplifier 6, and the signal lines A0, A1, . . . RA and the bit line precharge power supply VHB are connected through each fuse. As a current-limiting element 9, a fuse is used.

What is different about FIG. 12B from FIG. 6 is the fact that, instead of the VHB, the signal line A0 is connected to the four equalizer circuits within the sense amplifier circuits 60 and 61 controlled by the row selecting signal line YSW0.

In the configuration published in Patent Document 2 shown FIGS. 12A and 12B, when the short-circuit defect 15 between the bit line and word line occurs, the row selecting signal line YSW0, which has become faulty, is replaced by the column redundancy row selecting signal line RYSW and the fuse of the corresponding signal line A0 is cut off so that the leakage current is shut off.

[Patent Document 1]
Japanese Patent Kokai Publication No. 8-263983 (Claim 9, FIG. 3, FIG. 4, FIG. 5)

[Patent Document 2]
Japanese Patent Kokai Publication No. 7-334987 (Paragraph [0035], [0036], FIG. 1, FIG. 2, FIG. 3)

[Non-Patent Document 1]
IEEE JOURNAL OF SOLID-STATE CIRCUITS, VOL. 31, NO. 4, APRIL 1996, P558~P566, Fault-Tolerant Designs for 256 Mb DRAM, Toshiaki Kirihata, et al., Publication Date: NO. 4, April 1996, P563, FIG. 8

The entire disclosure of these documents are incorporated herein by reference thereto.

SUMMARY OF THE DISCLOSURE

In regard to the proper limit current level of the current-limiting element, published in Patent Document 1 mentioned above, and shown FIGS. 10A through 10D, at a maximum, the effect of the countermeasure cannot be gained unless it is a current level that can easily control 200 $\mu$A, a leakage current caused by a short-circuit defect between a bit line and word line. At a minimum, more than a current level of several nA (nanoamperes), which can elevate a normal bit line without any leakage current fault to the VHB level within a prescribed time according to the specifications (for example 200 u seconds according to the conventional DRAM specifications) when the power is turned on, is needed. According to our estimate, the proper current level of the current-limiting element is thought to be several $\mu$A.

At the NMOS transistor as a current-limiting element shown in FIG. 10A where the constant voltage level V1 is inputted into its gate, the level of the node A is the VHB level at the time of standby when there is no fault. On the other hand, when a leakage current caused by a short-circuit defect between a bit line and word line occurs, the level of the node A is below the VHB. At this time, since the source voltage of the NMOS transistor, the current-limiting element, is the node A and the gate voltage is the V1, the lower the level of the node A, the wider the VGS (the voltage between the gate sources) becomes, resulting in an increase in controllable current level. In other words, the lower the leakage resistance caused by a short-circuit defect is, the more the limit current level of the current-limiting element increases, creating a characteristic problem.

Similarly, in the case shown in FIG. 10D where a register is used as a current-limiting element, when a leakage current caused by a short-circuit defect occurs, the lower the leakage resistance becomes, the more the level of the node A decreases and the wider the potential difference between the two electrodes of the register becomes, resulting in an increase in limit current level and creating a characteristic problem.

At the depression-type NMOS transistor as a current-limiting element shown in FIG. 10C where its gate is connected to the node A, the level of the node A decreases when a leakage current caused by a short-circuit defect occurs. However, since the source and gate are short-circuited and VGS=0V is constant, it functions as a constant current source regardless of the level of the node A. Therefore, the current-limiting element has an excellent characteristic that it can limit to a current level set independent of the value of the leakage resistance caused by a short-circuit defect. However, since depression-type NMOS transistors are not used in a conventional DRAM, depression-type NMOS transistors have to be specially manufactured, creating a problem of an increase in manufacturing cost.

At the PMOS transistor as a current-limiting element shown in FIG. 10B where the constant voltage level V1 is inputted into its gate, the level of the node A decreases when a leakage current caused by a short-circuit defect occurs. However, since the source level is the VHB and VGS=VHB−V1 is constant, it functions as a constant current source regardless of the level of the node A. Therefore, the current-limiting element has an excellent characteristic that it can limit to a current level set independent of the value of the leakage resistance caused by a short-circuit defect. Furthermore, since a PMOS transistor, which is commonly used in a conventional DRAM, is used, there is no increase in manufacturing cost.

However, this means PMOS transistors as current-limiting elements 9 have to be provided on the sides of the equalizer circuits 1L and 1R in FIG. 9 or 11, and as a result, two new regions of N-well need to be added in the P-well region within the sense amplifier circuit 60. Since an wasted region with a width of several urn (micrometers) occurs as a well isolation area on the borderline between the N-well and P-well, there is a problem of an increase in layout area with this method.

Furthermore, memory cells deemed to have write/read faults are replaced with redundant cells by programming such as cutting the fuses during a preliminary test in the wafer state, however, a reliable replacement is not performed with the countermeasure of the conventional current-limiting element against the standby current fault caused by a short-circuit defect between a bit line and word line shown in FIGS. 9 and 11, resulting in a manufacturing yield reduction.

FIG. 11 is a drawing of a circuit configuration where the current-limiting element 9 is provided in a shared sense amplifier that is constituted such that the memory cell groups N7L and N7R are assigned to different column replacement segments. In this configuration, during the equalizing period, when the short-circuit defect 15 between the low-resistance bit line BL0LN and word line occurs, the level of the bit line BL0LN is decreased to around the level of the word line at the time of standby (the GND or VKK level). Since the bit line BL0LT is also short-circuited with the BL0LN by the equalizer circuit 1L, its level is decreased to a similarly low level. Also, since the node A0L is short-circuited with the bit line pair BL0LT, BL0LN by the equalizer circuit 1L, its level is decreased to a similarly low level, and the level of the bit line pair BL1LT, BL1LN, to which the level of the node A0L is supplied by the equalizer circuits, is also decreased to a similarly low level. If put into an active state by elevating the word line within the memory cell group N7L from such a state, the memory cells connected to the bit line pair BL0LT, BL0LN, and the bit line pair BL1LT, BL1LN will have write/read faults and the memory cell group 10 will be replaced by the column redundancy memory cell group R7L.

On the other hand, the shared switch circuits 2L and 2R are turned on during the equalizing period. Therefore, the levels of the bit line pair BL0RT, BL0RN and the bit line pair BL1RT, BL1RN and the level of a signal line A0R will be lower than the VHB. This lowered level is decided by the ratio of the on-resistances of the shared switch circuits 2L and 2R and the resistance value etc. of the current-limiting element 9, and it is an intermediate level between the level of the word line at the time of standby and the VHB level. The on-resistances of the shared switch circuits 2L and 2R, and the resistance value of the current-limiting element 9 fluctuate according to the fluctuation in temperature and fluctuation in power supply voltage. Therefore, the potential of the intermediate level fluctuates according to various conditions. If put into an active state by elevating the word line within the memory cell group N7R from such a state, an unstable state where it goes back and forth between having write/read faults in the memory cells connected to the bit line pair BL0RT, BL0RN, and the bit line pair BL1RT, BL1RN, and being non-defective, will be created. Because of this, it becomes difficult to reliably detect the memory cell group connected to the bit line pair BL0RT, BL0RN, and the bit line pair BL1RT, BL1RN as write/read faulty bits during a preliminary test in the wafer state, and the case where the replacement by the column redundancy memory cell group is not performed might occur. Therefore, a problem, where many faults occur in a selection test after the replacement process by programming such as cutting the fuses, arises, resulting in a manufacturing yield reduction.

Further, in the configuration of Patent Document 2 shown in FIG. 12A, a fuse as a current-limiting element 9 is provided for each of the signal lines A0, A1, . . . RA, and the signal lines A0, A1, . . . RA, are supplied to all of the sense amplifiers 6, which control the memory cell plates 7 on row numbers 0 through M. When a short-circuit defect between the bit line and word line occurs, the row selecting signal line that corresponds to the defect is replaced by the column redundancy row selecting signal line RYWS, and at the same time, the fuse of the signal line that corresponds to the defect is cut off. Therefore, M+1 number of memory cell groups on row number 0 through M inevitably become one big column replacement segment in this configuration. Such a big column replacement segment has problems in terms of the layout area and relieving rate.

There is much to be desired in the art as aforementioned.

Therefore, it is an object of the present invention to restrain and decrease the layout area while properly dealing with the standby current fault caused by a short-circuit defect between a bit line and word line in a dynamic semiconductor memory device, achieve a high redundancy relieving rate, and provide a device wherein reliable redundancy relief is possible.

In order to achieve the object mentioned above, in a summary, the invention disclosed in the present application provides a configuration in a shared sense amplifier wherein one common current-limiting element is provided for an equalizer circuit for a bit line pair on one side and an equalizer circuit for a bit line pair on the other side, and a bit line precharge potential is supplied to the equalizer circuits on the both sides through the common current-limiting element.

A semiconductor memory device according to a first aspect of the present invention comprises memory cell groups oppositely disposed on one side and the other side, multiple bit line pairs, on one side, connected to the memory cell group on the same one side, multiple bit line pairs, on the other side, connected to the memory cell group on the same other side, and a shared sense amplifier, which is provided in between the memory cell groups on one side and the other side, and controls the bit line pair on the one side and the bit line pair on the other side. The shared sense amplifier comprises an equalizer circuit, on one side, connected to each of the bit line pair on the same one side; an equalizer circuit, on the other side, connected to each of the bit line pair on the same other side; one or a multiple of the equalizer circuits on one side; one or a multiple of the equalizer circuits on the other side; and one current-limiting element that supplies a bit line precharge potential to one or a multiple of the equalizer circuits on one side and the other side. The memory cell group on one side and the memory cell group on the other side are assigned to different units in terms of a unit of memory cell group, connected to each of the equalizer circuit on one side and the equalizer circuit on the other side, sharing the current-limiting element, that is to be replaced by the same group in column redundancy termed "column replacement segment" hereafter.

A semiconductor memory device according to a second aspect of the present invention comprises memory cell groups oppositely disposed on one side and the other side; multiple bit line pairs, on one side, connected to the memory cell group on the same one side; multiple bit line pairs, on the other side, connected to the memory cell group on the same other side; and a shared sense amplifier, which is provided in between the memory cell groups on one side and the other side, and controls the bit line pair on the one side and the bit line pair on the other side. The shared sense amplifier comprises an equalizer circuit, on one side, connected to each of the bit line pair on the same one side; and an equalizer circuit, on the other side, connected to each of the bit line pair on the same other side. A first column selecting line is set to an active state and one or a multiple of the bit line pair, which is on one side and performs write/read operation, is replaced by a column redundancy bit line pair as a set when the memory cell group on one side is in an active state, the first column selecting line is set to an active state and one or a multiple of the bit line pair, which is on the other side and performs write/read operation, is replaced by a column redundancy bit line pair as a set when the memory cell group on the other side is in an active state. One current-limiting element, which commonly supplies a bit line precharge potential to the equalizer circuit, on one side, connected to each of one or a multiple of the bit line pair on the same side, and to the equalizer circuit, on the other side, connected to each of one or a multiple of the bit line pair on the same side is provided. The memory cell group on one side and the memory cell group on the other side are assigned to different units in terms of a unit of memory cell group, connected to each of the equalizer circuit on one side and the equalizer circuit on the other side, sharing the current-limiting element, that is to be replaced by the same group in column redundancy termed "column replacement segment" hereafter.

In the present invention, the current-limiting element can be comprised of a PMOS transistor wherein a first terminal is connected to the bit line precharge power supply and a second terminal is connected in common to the equalizer circuits on one side and the other side.

The present invention can have a configuration wherein at least one of the following: a reference voltage (GND), the substrate voltage of a memory cell transistor (VBB), and the standby voltage of a word line (VKK), can be supplied to the gate of the PMOS transistor.

The present invention can have a configuration wherein the PMOS transistor is provided in the same N-well region as an N-well where a PMOS transistor, which constitutes a PMOS sense circuit constituting the shared sense amplifier, is disposed.

The present invention can have a configuration wherein a capacitor plate layer, which is connected commonly to one ends of multiple cell capacitors of a memory cell group, is used as the wiring layer of the wiring that supplies the bit line precharge potential commonly to one or a multiple of the equalizer circuits on one side and one or a multiple of the equalizer circuits on the other side from the current-limiting element.

The present invention can have means for variably switch-controlling the limit current level of the current-limiting element.

The present invention can have a configuration with means for switching to a voltage selected from a reference voltage, the substrate voltage of a memory cell transistor, and the standby voltage of a word line as the voltage supplied to the gate of the PMOS transistor constituting the current-limiting element.

In the present invention, the limit current level of the current-limiting element can be switched based on the test mode, or a fuse that variably controls the limit current level of the current-limiting element based on whether it is cut or not can be provided, and the limit current level of the current-limiting element can be switched by cutting the fuse.

According to a third aspect of the present invention, there is provided a dynamic semiconductor memory device comprising: two memory arrays, each having redundant cells, oppositely disposed on one side and the other side; and a sense amplifier circuit connected in between the two memory arrays.

The sense amplifier circuit comprises;

an equalizer circuit on one side having two active elements, provided for a bit line pair of the memory array on one side, one end of which is connected to each of the bit line pair, and driving each of the bit line pair to a bit precharge voltage during a precharge equalizing operation according to a bit precharge voltage inputted into the other end, and one active element inserted in between the bit line pair, and wherein the control terminals of the three active elements are connected in common to a first equalizer control signal;

an equalizer circuit on the other side having two active elements, provided for a bit line pair of the memory array on the other side, one end of which is connected to each of the bit line pair, and driving each of the bit line pair to a bit precharge voltage during a precharge equalizing operation according to a bit precharge voltage inputted into the other end, and one active element inserted in between the bit line pair, and wherein the control terminals of the three active elements are connected in common to a second equalizer control signal;

a sense circuit receiving a voltage of a bit line pair at a first and second nodes, differentially amplifying and outputting it to the first and second nodes;

a first switch performing on/off control of a connection between ends of a bit line pair connected to the equalizer circuit on one side and the first and second nodes of the sense circuit based on an inputted control signal;

a second switch performing on/off control of a connection between ends of a bit line pair connected to the equalizer circuit on the other side and the first and second nodes of the sense circuit based on an inputted control signal and;

a switch performing on/off control of an IO line that corresponds to the fist and second nodes of the sense circuit based on an inputted column selecting signal, and;

a current-limiting element, provided commonly for a pair of the equalizer circuit on one side and the other side, whose one end is connected to a bit line precharge power supply, into whose control terminal a prescribed voltage is inputted, whose other end is commonly connected to the other end of two active elements driving the bit line pair to a bit precharge voltage, is provided.

The memory cell group on one side and the memory cell group on the other side are assigned to different units in terms of a unit of memory cell group, connected to each of the equalizer circuit on one side and the equalizer circuit on the other side, sharing the one current-limiting element, that is to be replaced by the same group in column redundancy termed "column replacement segment" hereafter.

The current-limiting element may be provided commonly for the multiple equalizer circuits on one side and multiple the equalizer circuits on the other side; and one end of the current-limiting element may be connected to a bit line precharge power supply, a prescribed voltage is inputted into a control terminal, the other end is commonly connected to the other end of two active elements driving the bit line pair to a bit precharge potential in the multiple equalizer circuits on one side, and is commonly connected to the other end of two active elements driving the bit line pair to a bit precharge voltage in the multiple equalizer circuits on the other side.

The data of a bit line pair connected to the multiple equalizer circuits on one side and a bit line pair connected to the multiple equalizer circuits on the other side may be connected to an IO line that corresponds through a switch turned on/off by a common column selecting signal.

The meritorious effects of the present invention are summarized as follows.

According to the present invention, by providing one common current-limiting element for an equalizer circuit for a bit line pair on one side and an equalizer circuit for a bit line pair on the other side in a shared sense amplifier of a dynamic semiconductor memory device, and having a configuration wherein a bit line precharge potential, which is current-limited by a current-limiting element, is supplied to the both equalizer circuits on one side and the other side, a high redundancy relieving rate can be achieved with a small layout area while dealing with a standby current fault caused by a short-circuit defect between a bit line and word line.

Also, according to the present invention, since means for varying the limit current value of the current-limiting element is provided, reliable redundancy relief becomes possible.

BRIEF DESCRIPTION OF THE DRAWINGS

FIGS. 10A through 10D are drawings showing respective examples of the circuit configurations of the current-limiting element and equalizer circuits shown in FIG. 9.

PREFERRED EMBODIMENTS OF THE INVENTION

The present invention will be explained in detail in reference to the attached drawings.

A preferred embodiment of the present invention will be explained. An overall array configuration of a dynamic semiconductor memory device of an embodiment according to the present invention is the configuration shown in FIG. 1, and an explanation on it is omitted here in order to avoid repetitions. Reference should be made to the disclosure in the introductory part of this specification, background of the invention. Hereinafter, configurations of shared sense amplifiers, etc. according to the present invention will be described in detail.

Embodiment 1

Figure 1:
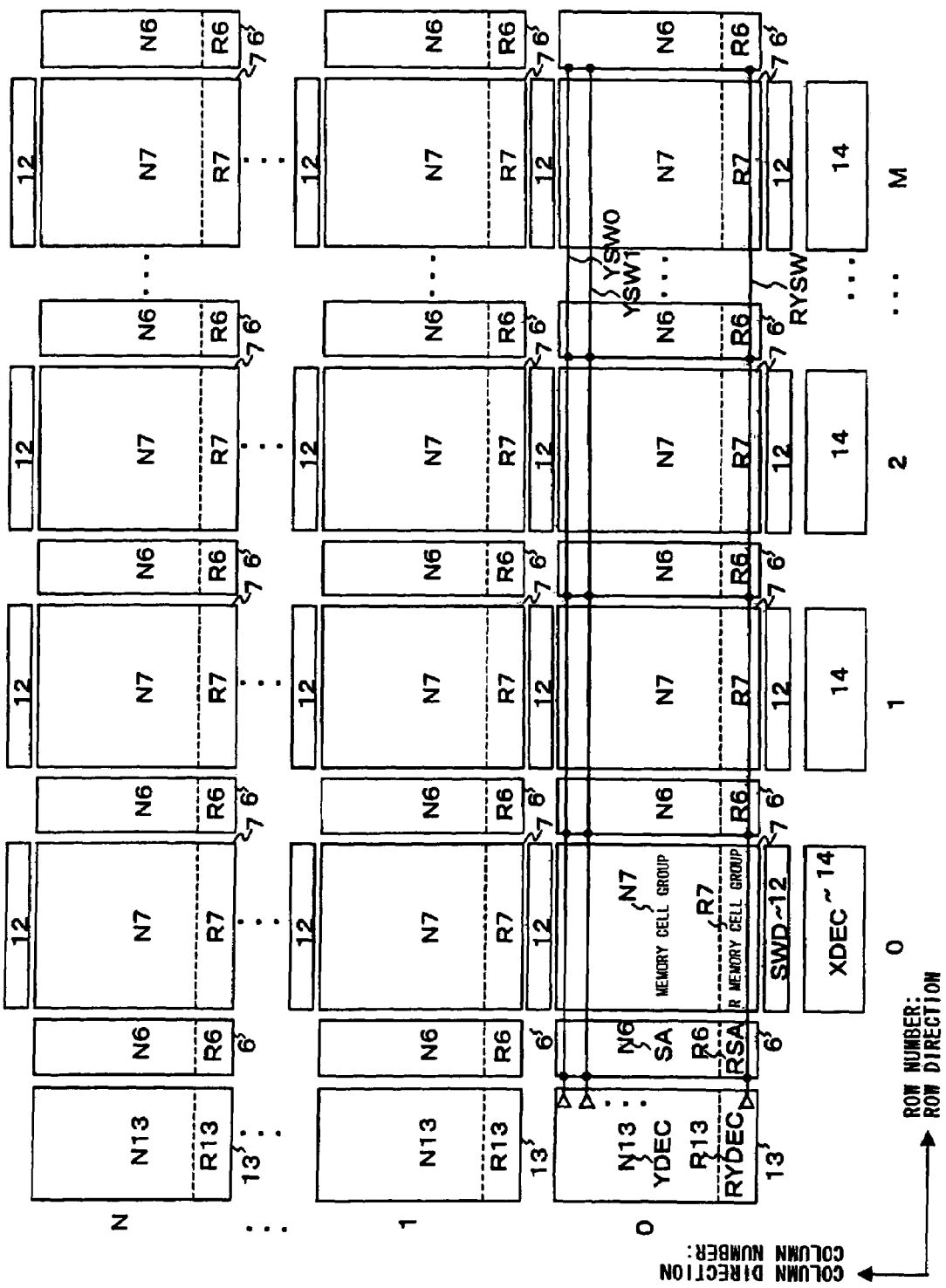
FIG. 1 is a drawing showing the array configuration of a dynamic semiconductor memory device of an embodiment according to the present invention.
Figure 2:
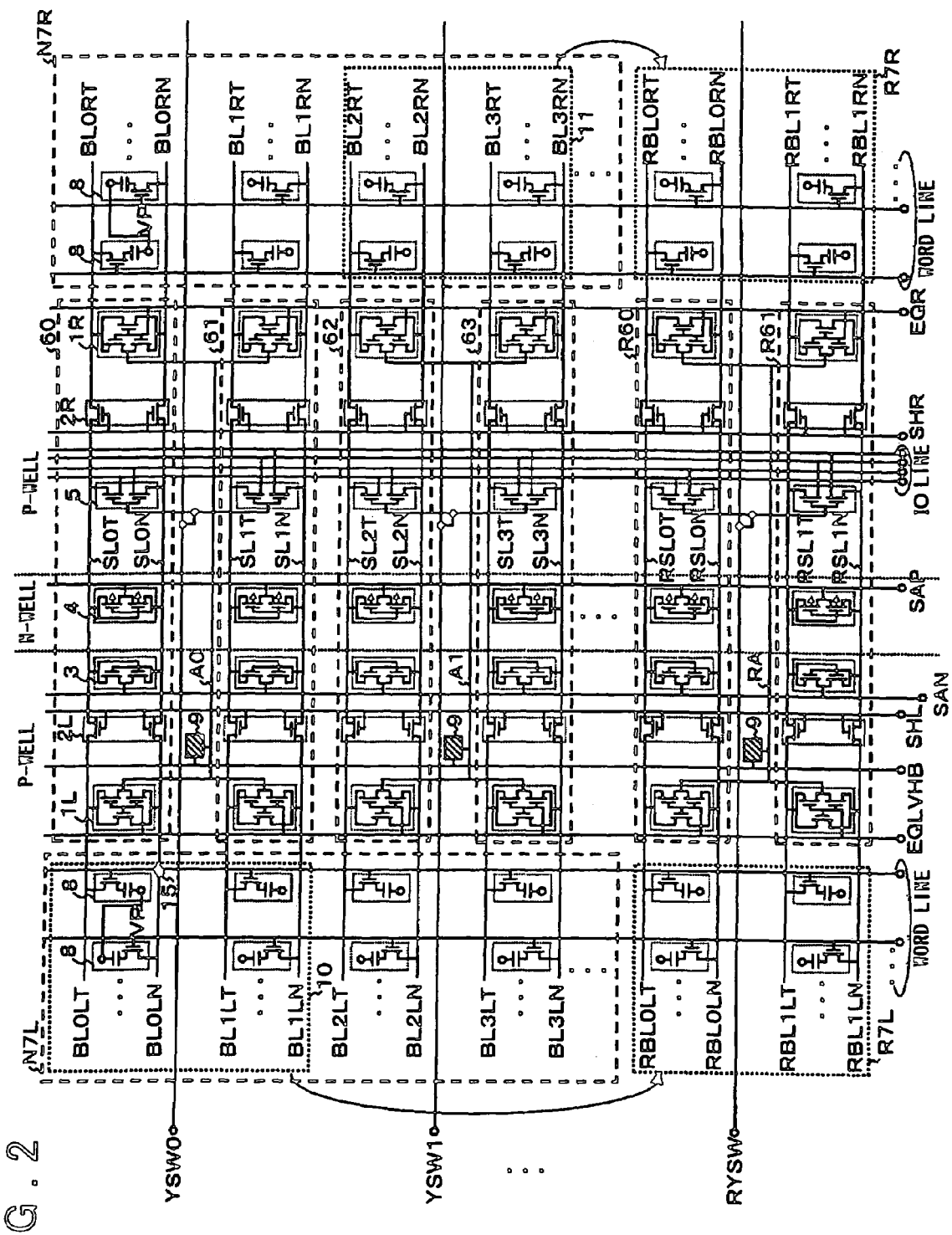
FIG. 2 is a drawing showing an example of the circuit configuration of a shared sense amplifier of an embodiment according to the present invention.

FIG. 2 is a drawing showing an embodied configuration of a shared sense amplifier of a dynamic semiconductor memory device of an embodiment according to the present invention shown in FIG. 1. In FIG. 2, one sense amplifier 6 (60 . . . 63, R60, R61), which is sandwiched by the memory cell plates 7 in FIG. 1, is shown. As shown in FIG. 2, in the present embodiment, the memory cell group N7L on the left side and the memory cell group N7R on the right side are assigned to different column replacement segments, respectively.

Figure 11:
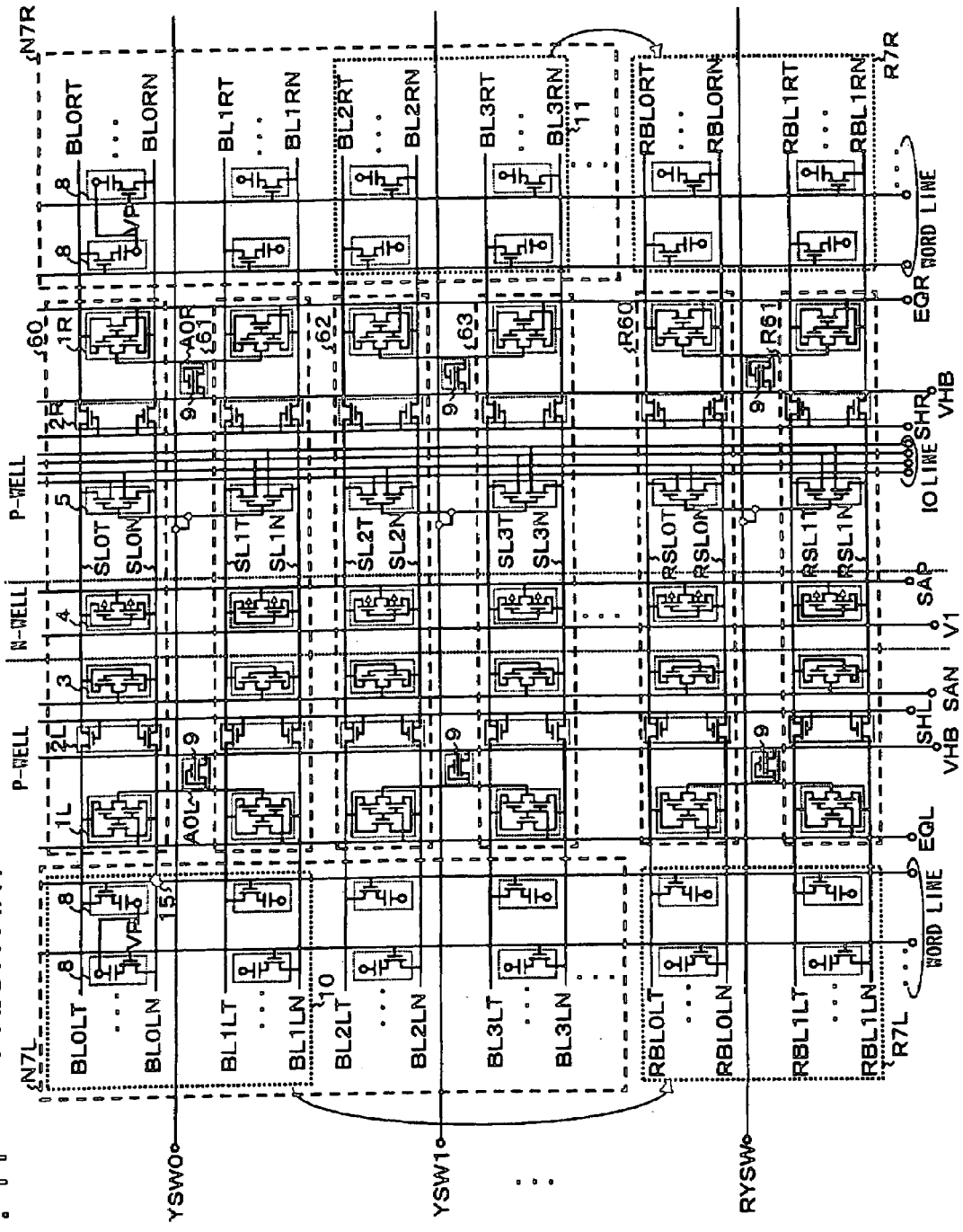
FIG. 11 is a drawing showing an example of the circuit configuration of a conventional shared sense amplifier.

What is different about the configuration of the present embodiment shown in FIG. 2 from the conventional configuration in FIG. 11 is the fact that one common current-limiting element 9 is provided for a total of four equalizer circuits: two equalizer circuits 1L connected to two bit line pairs BL0LT, BL0LN and BL1LT, BL1LN, which are to be replaced by a column redundancy memory cell group as a set, and two equalizer circuits 1R connected to two bit line pairs BL0RT, BL0RN and BL1RT, BL1RN, which are to be replaced by a column redundancy memory cell group as another set, one electrode of the current-limiting element 9 is connected to the bit line precharge power supply VHB, the other electrode is connected to the node A0, and the node A0 are connected in common to the four equalizer circuits. The equalizer circuit 1L comprises three transistors: an NMOS transistor whose electrodes are connected to each line of a bit line pair, an NMOS transistor whose electrode is connected to the node A0 and other electrode is connected to one line of a bit line pair, an NMOS transistor whose electrode is connected to the node A0 and other electrode is connected to the other line of the bit line pair, and the gates of these three NMOS transistors are connected in common to the control line EQL. The equalizer circuit 1R has the same configuration as the equalizer circuit 1L, and the gates of the three NMOS transistors are connected in common to the control line EQR.

When the short-circuit defect 15 between the bit line BL0LN and word line occurs, the leakage current is controlled by the current-limiting element 9 and the standby current fault can be solved.

When the short-circuit defect 15 between the low-resistance bit line BL0LN and word line occurs, as in FIG. 11, during the equalizing period, the level of the bit line pair BL0LT, BL0LN is decreased to around the level of the word line at the time of standby (the GND or VKK level). Since the node A0 is also short-circuited with the bit line pair BL0LT. BL0LN by the equalizer circuit 1L, its level is decreased to a similarly low level.

Furthermore, the levels of the bit line pair BL1LT, BL1LN, bit line pair BL0RT, BL0RN, and bit line pair BL1RT, BL1RN, to which the potential of the node A0 is supplied, are also decreased to a similarly low level.

If put into an active state by elevating the word line within the memory cell group N7L from such a state, the memory cells connected to the bit line pair BL0LT, BL0LN, and bit line pair BL1LT, BL1LN will have write/read faults as is the case with the conventional example.

Further, in the present embodiment, even when put into an active state by elevating the word line within the memory cell group N7R, the memory cells connected to the bit line pair BL0RT, BL0RN, and bit line pair BL1RT, BL1RN can be stably detected to have write/read faults as well.

Therefore, the memory cell group connected to the bit line pair BL0RT, BL0RN, and bit line pair BL1RT, BL1RN can be replaced with a column redundancy memory cell group during a preliminary test in the wafer state more reliably than the conventional configuration in FIG. 11, and the manufacturing yield during a selection test after the replacement process can be improved compared to the conventional configuration in FIG. 11.

Furthermore, the number of the current-limiting elements is reduced to half compared to the conventional countermeasure against the standby current fault shown in FIG. 11, therefore, it has the effect of reducing the layout area.

Embodiment 2

Figure 3:
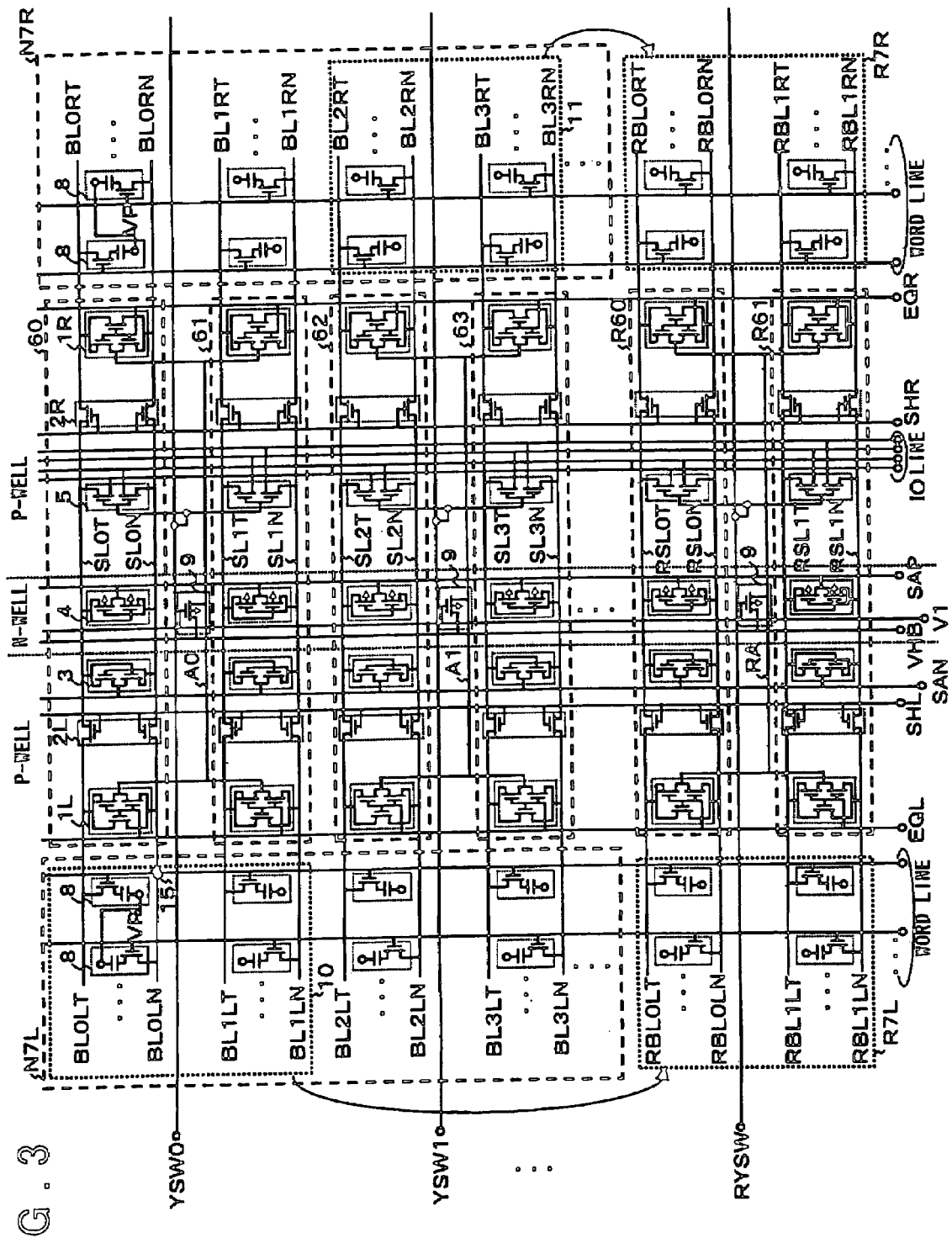
FIG. 3 is a drawing showing an example of the circuit configuration of a shared sense amplifier of an embodiment according to the present invention.

FIG. 3 is a drawing showing a more concrete configuration of an embodiment according to the present invention. What is different about the configuration of the present embodiment shown in FIG. 3 from the embodiment described above and shown in FIG. 2 is the fact that a PMOS transistor, wherein the constant voltage level V1 is connected to the gate, is used as the current-limiting element 9, and the PMOS transistors are provided in the zonally-arranged N-well region, where PMOS sense circuits 4 are provided.

As types of the current-limiting element, the configurations shown in FIGS. 10A through 10D are published as the conventional technology. Out of these, the configuration of FIG. 10B where a PMOS transistor is used as the current-limiting element is the most superior from the standpoints of limit current characteristics and manufacturing cost.

However, there is a problem with the way the current-limiting element 9 is placed conventionally (refer to FIG. 11) because it requires a new well isolation area, resulting in an increase in layout area.

On the other hand, according to the present invention, a new well isolation area is not required as shown in FIG. 3, the problem with the increase in layout area is greatly reduced. In other words, the effect of restraining and reducing the increase in area can be achieved.

As described above, according to the present invention, a current-limiting element with superior limit current characteristics can be realized with a small layout area and without an increase in manufacturing cost.

The level of the constant voltage V1 is set to the level with which the PMOS transistor used as the current-limiting element 9 can send a proper current (for example several μ A). For example, the power supply voltage of the GND, VKK, or VBB, etc. can be used.

Embodiment 3

In FIG. 3, there is a case where the short-circuit defect 15 between the bit line BL0LN and word line has a somewhat high resistance. In this case, the level of the nodes A0, etc. during the equalizing period is an intermediate level between the level of the word line at the time of standby (the GND or VKK level) and the bit line precharge power supply VHB. This intermediate level is decided by the ratio of the resistance value of the short-circuit defect and the resistance value etc. of the current-limiting element 9. Therefore, the level of the node A0, etc. fluctuates according to various conditions such as the fluctuation in temperature. As a result, there will be some cases where the bit line pair BL0LT, BL0LN, bit line pair BL1LT, BL1LN, bit line pair BL0RT, BL0RN, and bit line pair BL1RT, BL1RN cannot be stably detected to have write/read faults during a preliminary test in the wafer state. If this happens, faults will occur during a selection test after the replacement process, resulting in a big manufacturing yield reduction.

In order to solve this problem, the present embodiment has a configuration with means for varying the limit current value of the current-limiting element 9.

In the present embodiment, for example, the constant voltage level V1 supplied to the gate of the current-limiting element (PMOS transistor) 9 is normally set to, for instance, a VBB.

Further, in the present embodiment, the constant voltage level V1 is set to a higher level than normal at the time of a preliminary test in the wafer state (for example the GND). By doing this, the limit current level of the PMOS transistor as the current-limiting element 9 becomes lower at the time of the preliminary test in the wafer state, and it becomes possible to set the levels (potentials) of the node A0, bit line pair BL0LT, BL0LN, bit line pair BL1LT, BL1LN, bit line pair BL0RT, BL0RN, and bit line pair BL1RT, BL1RN lower than normal during the equalizing period. As a result, normally unstable memory cells that go back and forth between having write/read faults and being non-defective can be stably detected to have write/read faults and reliably replaced by column redundancy memory cells during the preliminary test in the wafer state.

As described above, according the present embodiment, even when a high resistance short-circuit defect between the bit line and word line bit line occurs, manufacturing yield can be improved.

Changing the set voltage of the constant voltage level V1 is performed by the test mode (an inputted test mode signal) and cutting the fuses, etc.

Figure 12A:
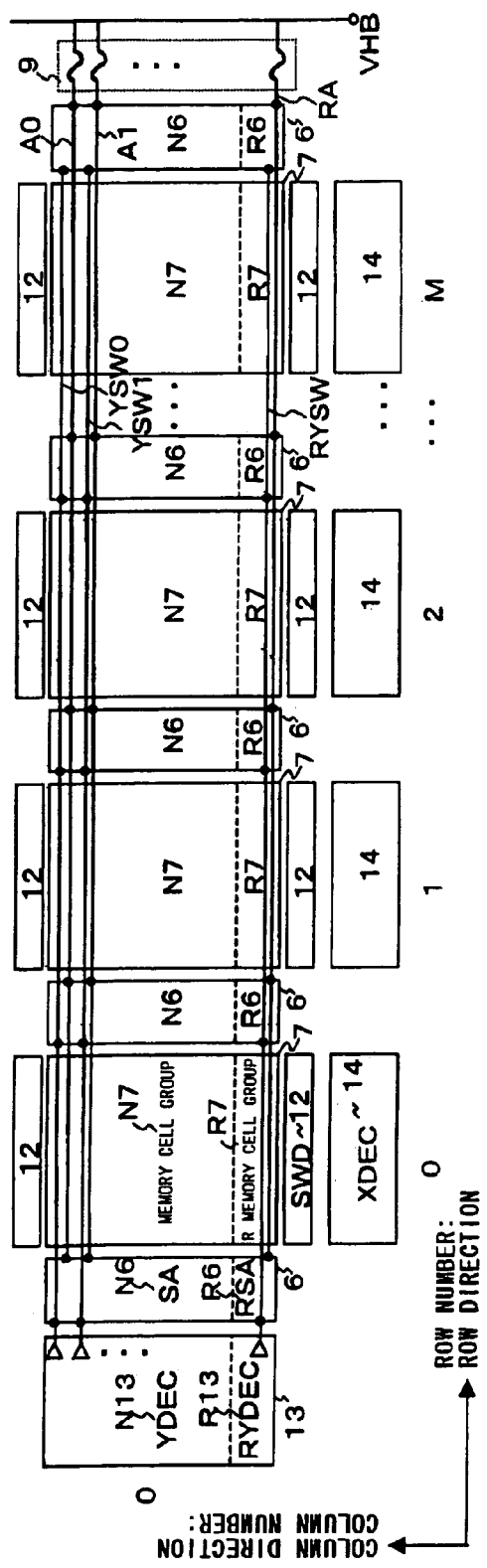
FIG. 12A is a drawing showing the array configuration of a conventional dynamic semiconductor memory device.
Figure 12B:
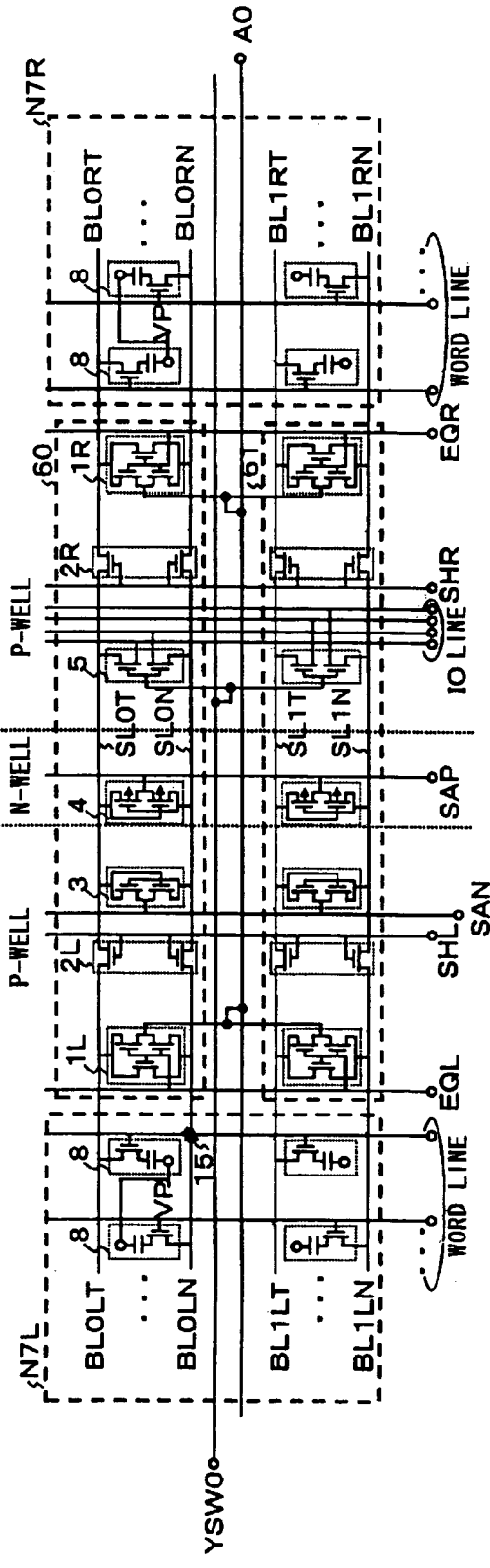
FIG. 12B is a drawing showing an example of the circuit configuration of the shared sense amplifier shown in FIG. 12A.

According to the present embodiment, even if a column replacement segment on one side and a column replacement segment on the other are assigned to different shared sense amplifiers, reliable redundancy relief can be performed. Therefore, since it can have small column replacement segment partitions as in the conventional DRAM, the layout area of column redundancy cells can be reduced and relieving rate can be improved compared to the conventional technology shown in FIGS. 12A and 12B.

Embodiment 4

Figure 4:
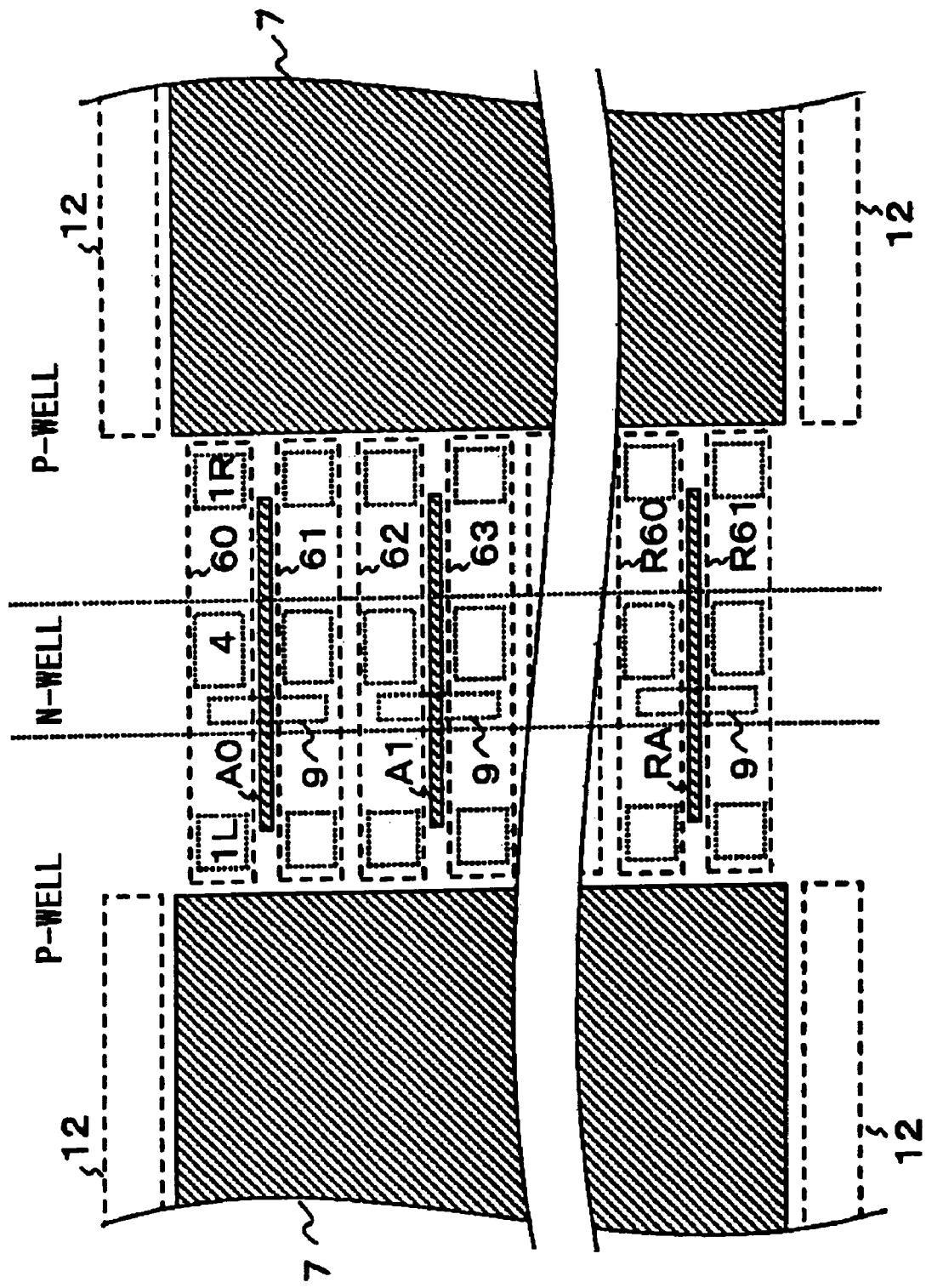
FIG. 4 is a drawing showing a layout example of a shared sense amplifier circuit of an embodiment according to the present invention.

FIG. 4 is a drawing showing a layout configuration of an embodiment according to the present invention. The aim of the present embodiment is to wire the signal lines A0, A1 . . . RA in the embodiment shown in FIG. 3 efficiently. In the previous embodiment shown in FIG. 3, an electrode of the cell capacitor of each memory cell 8 is connected to a conductive layer called "capacitor plate," to which the voltage VP is supplied.

In the present embodiment, the memory plate 7 is covered with the capacitor plate shown as hatched area in FIG. 4.

On the other hand, the conductive layer of the capacitor plate is generally not used for the regions of the conventional sense amplifier circuits 60, 61, 62, 63, . . . R60, R61.

Figure 6:
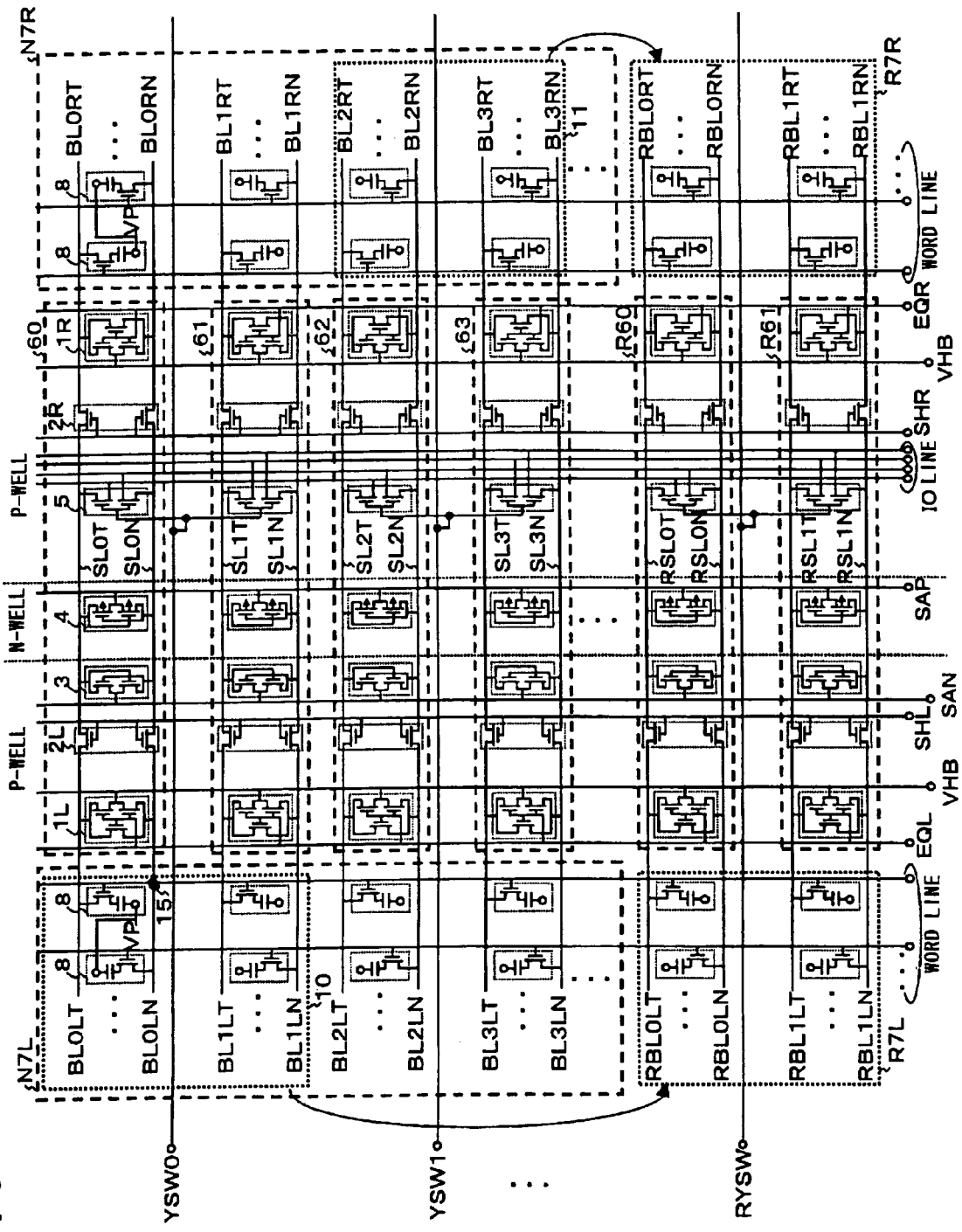
FIG. 6 is a drawing showing an example of the circuit configuration of a conventional shared sense amplifier.
Figure 7:
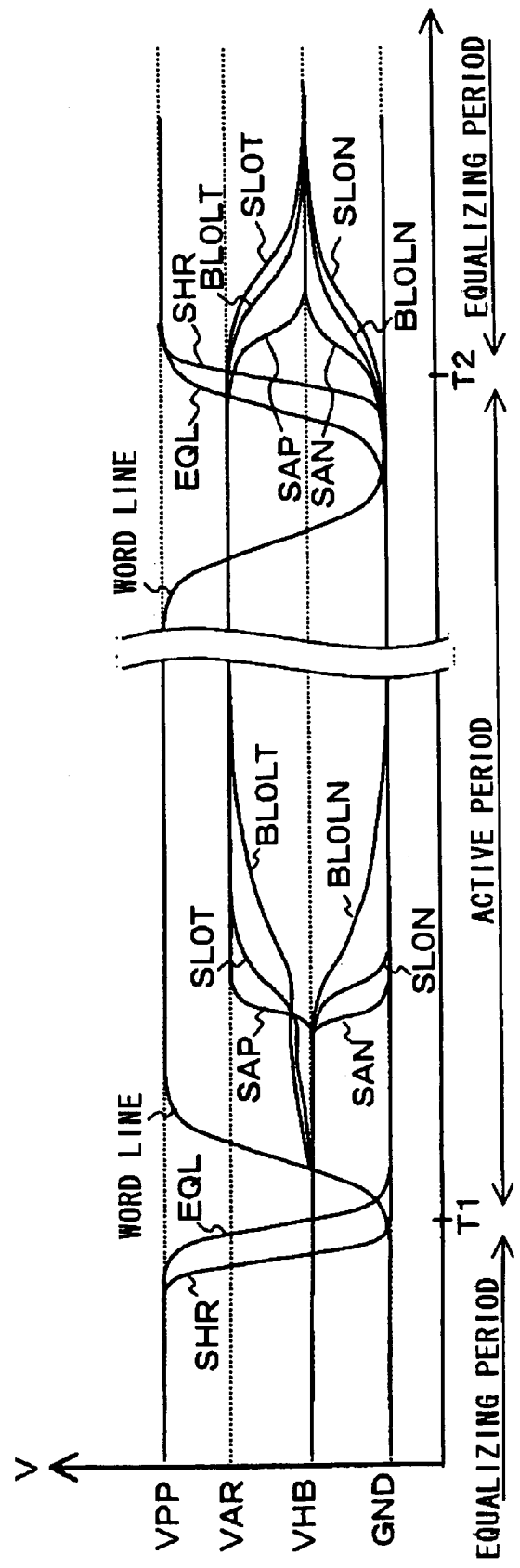
FIG. 7 is a timing chart showing the operation of FIG. 6.
Figure 8:
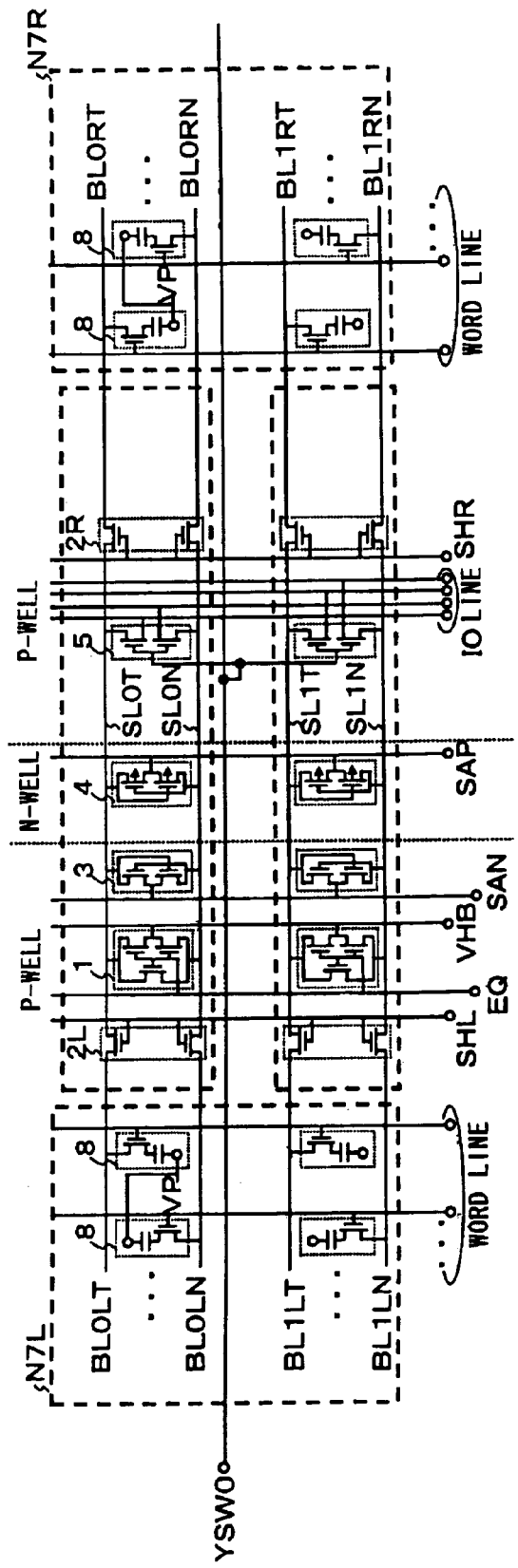
FIG. 8 is a drawing showing an common example of the circuit configuration of a conventional shared sense amplifier.
Figure 9:
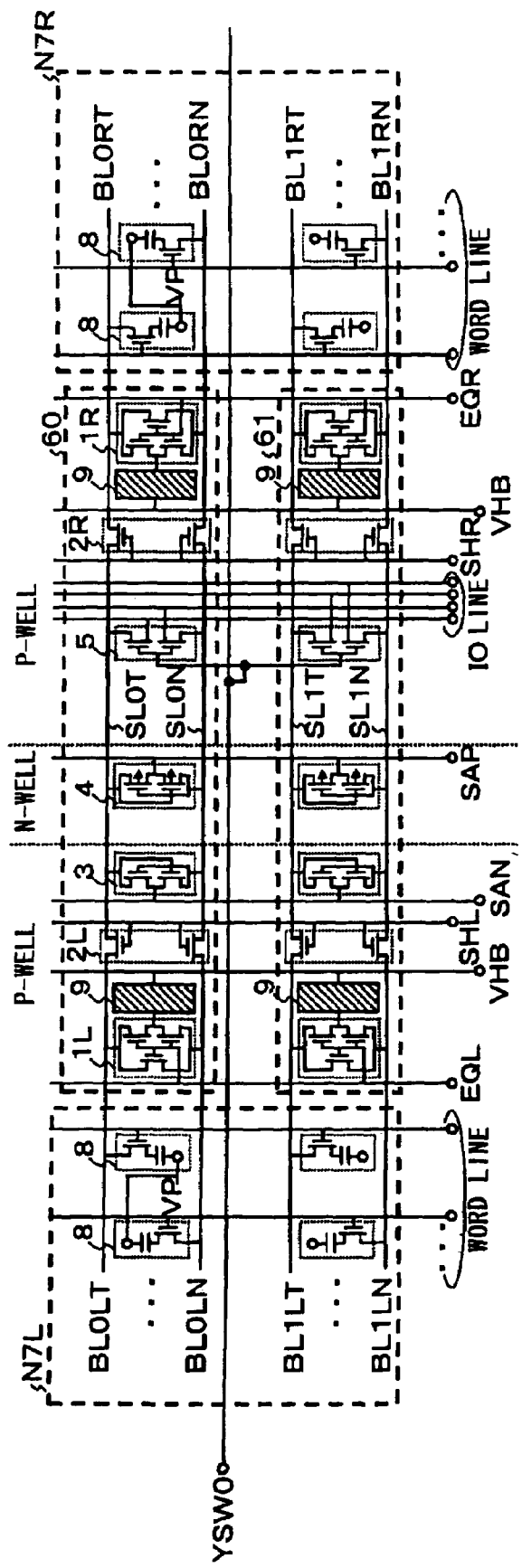
FIG. 9 is a drawing showing an example of the circuit configuration of a conventional shared sense amplifier.

In the present embodiment, the conductive layer of the capacitor plate is used as wiring of the signal lines A0, A1 . . . RA. By configuring like this, even if one current-limiting element 9 is shared by the equalizer circuits provided on one side and the other side of the shared sense amplifier, and the signal lines A0, A1 . . . RA are wired to the both equalizer circuits, adding a new wiring layer and a drastic deviation from the conventional layout will not be required during the manufacturing process, and the standby current fault caused by a short-circuit defect between a bit line and word line can be solved with simpler modifications, compared to the conventional circuit shown in FIG. 6.

Embodiment 5

In the previous embodiment shown in FIG. 2, an example of an application of the present invention where one row selecting signal line is inputted into one sense amplifier circuit was explained, however, the present invention can also be applied to cases where one row selecting signal line is inputted into one sense amplifier circuit, and one row selecting signal line is inputted into more than four sense amplifier circuits.

Figure 5:
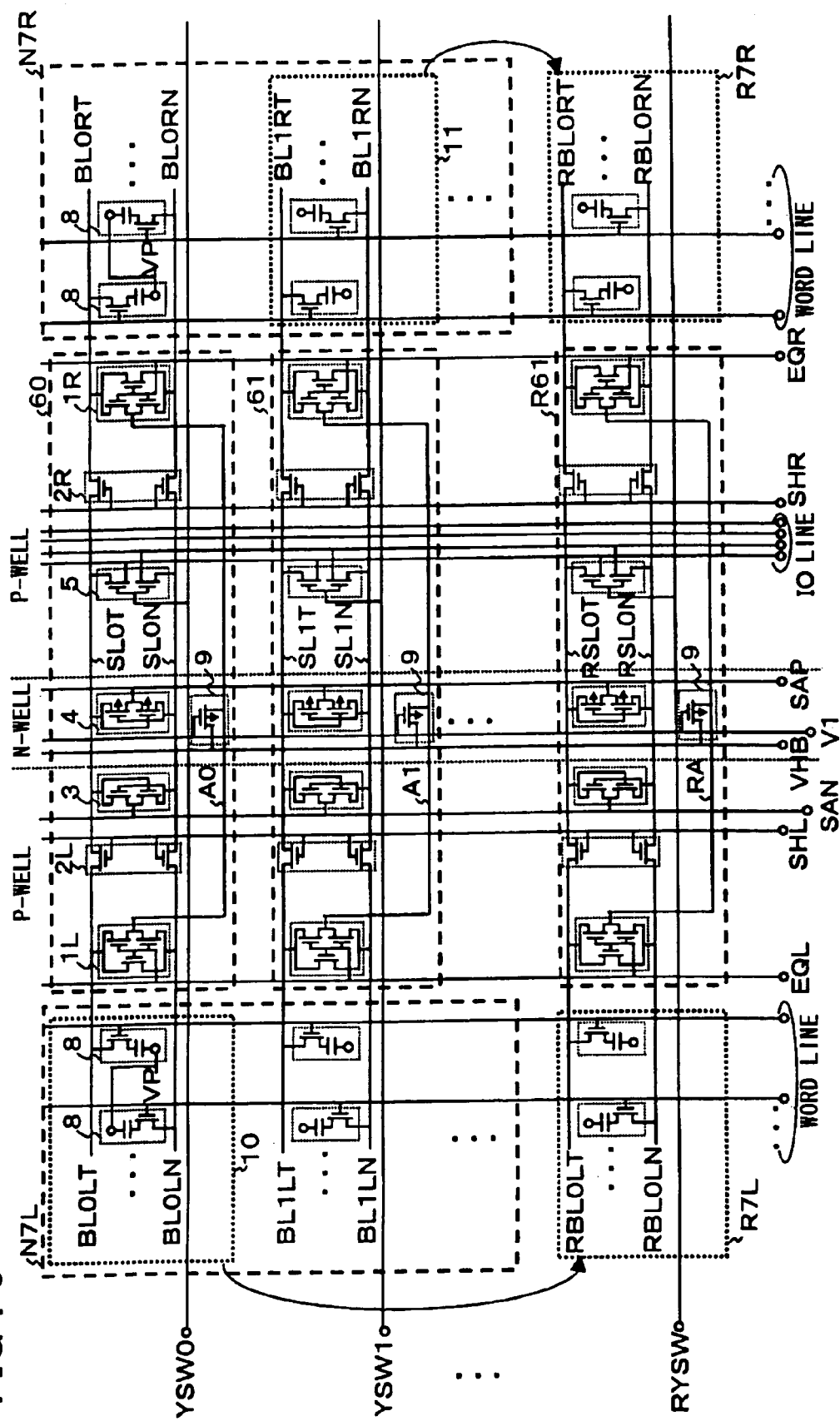
FIG. 5 is a drawing showing an example of the circuit configuration of a shared sense amplifier of an embodiment according to the present invention.

FIG. 5 is a drawing showing an embodied configuration according to the present invention where one row selecting signal line is inputted into one sense amplifier circuit. As shown in FIG. 5, the memory cell group N7L on the left side of the shred sense amplifier and the memory cell group N7R on the right side have different column replacement segments in the present embodiment as well. Furthermore, it is a configuration where a bit line pair is replaced as a set.

One common current-limiting element 9 is provided for two equalizer circuits: the equalizer circuit 1L and the equalizer circuit 1R, and one electrode of the current-limiting element 9 is connected to the bit line precharge power supply VHB and the other electrode to the node A0. Furthermore, the node A0 is connected to the two equalizer circuits 1L, 1R.

Similarly, in the case where one row selecting signal line is inputted into four sense amplifier circuits, one common current-limiting element 9 is provided for a total of eight equalizer circuits on one side and the other side of the shared sense amplifier. These equalizer circuits are connected to a total of eight bit line pairs (four pairs on one side and four pairs on the other) respectively, each of which is replaced as a set. One electrode (source or drain) of the current-limiting element 9 is connected to the bit line precharge power supply VHB, the other electrode is connected to the node A0, and the node A0 is connected to the eight equalizer circuits, whereas its gate is connected to V1. Further, the current-limiting elements are disposed in the N-well region.

The present invention has been explained above using examples of embodiment, however, the present invention is not limited to the above embodiments, and it goes without saying that it includes various modifications and revisions, which may be made possible by a manufacturer within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A dynamic semiconductor memory device comprising:
   memory cell groups oppositely disposed on one side and the other side;
   multiple bit line pairs, on one side, connected to said memory cell group on the one side;
   multiple bit line pairs, on the other side, connected to said memory cell group on the same other side and;
   a shared sense amplifier, which is provided in between said memory cell groups on one side and the other side, and controls said bit line pair on the one side and said bit line pair on the other side;
   said shared sense amplifier comprising;
   an equalizer circuit, on one side, connected to each of said bit line pair on the one side;
   an equalizer circuit, on the other side, connected to each of said bit line pair on the same other side;
   one or a multiple of said equalizer circuits on one side, and one or a multiple of said equalizer circuits on the other side; and
   one current-limiting element that supplies a bit line precharge potential to one or a multiple of said equalizer circuits on one side and the other side;
   wherein said memory cell group on one side and said memory cell group on the other side are assigned to different units in terms of a unit of memory cell group, connected to each of said equalizer circuit on one side and said equalizer circuit on the other side, sharing said one current-limiting element, that is to be replaced by the same group in column redundancy, termed "column replacement segment" hereafter.

2. A dynamic semiconductor memory device comprising;
   memory cell groups oppositely disposed on one side and the other side;
   multiple bit line pairs, on one side, connected to said memory cell group on the one side;
   multiple bit line pairs, on the other side, connected to said memory cell group on the other side; and
   a shared sense amplifier, which is provided in between said memory cell groups on one side and the other side, and controls said bit line pair on the one side and said bit line pair on the other side;
   said shared sense amplifier comprising;
   an equalizer circuit, on one side, connected to each of said bit line pair on the one side; and
   an equalizer circuit, on the other side, connected to each of said bit line pair on the other side;
   wherein a first column selecting line is set to an active state and one or a multiple of said bit line pair, which is on one side and performs write/read operation, is replaced by a column redundancy bit line pair as a set when said memory cell group on one side is in an active state;

said first column selecting line is set to an active state and one or a multiple of said bit line pair, which is on the other side and performs write/read operation, is replaced by a column redundancy bit line pair as a set when said memory cell group on the other side is in an active state;

one current-limiting element, which commonly supplies a bit line precharge potential to said equalizer circuit, on one side, connected to each of one or a multiple of said bit line pair on the same side, and to said equalizer circuit, on the other side, connected to each of one or a multiple of said bit line pair on the same side is provided; and said memory cell group on one side and said memory cell group on the other side are assigned to different units in terms of a unit of memory cell group, connected to each of said equalizer circuit on one side and said equalizer circuit on the other side, sharing said current-limiting element, that is to be replaced by the same group in column redundancy termed "column replacement segment" hereafter.

3. The dynamic semiconductor memory device as defined in claim 1 wherein said current-limiting element comprises a PMOS transistor whose first terminal is connected to a bit line precharge power supply and second terminal is connected in common to said equalizer circuits on one side and the other side as a power supply terminal supplying said bit line precharge potential.

4. The dynamic semiconductor memory device as defined in claim 2 wherein said current-limiting element comprises a PMOS transistor whose first terminal is connected to a bit line precharge power supply and second terminal is connected in common to said equalizer circuits on one side and the other side as a power supply terminal supplying said bit line precharge potential.

5. The dynamic semiconductor memory device as defined in claim 3 wherein at least one of a reference voltage (GND), the substrate voltage of a memory cell transistor (VBB), and the standby voltage of a word line (VKK) is supplied to the gate of said PMOS transistor.

6. The dynamic semiconductor memory device as defined in claim 4 wherein at least one of a reference voltage (GND), the substrate voltage of a memory cell transistor (VBB), and the standby voltage of a word line (VKK) is supplied to the gate of said PMOS transistor.

7. The dynamic semiconductor memory device as defined in claim 3 wherein said PMOS transistor is provided in the same N-well region as an N-well, where a PMOS transistor, which constitutes a PMOS sense circuit constituting said shared sense amplifier, is disposed.

8. The dynamic semiconductor memory device as defined in claim 4 wherein said PMOS transistor is provided in the same N-well region as an N-well, where a PMOS transistor, which constitutes a PMOS sense circuit constituting said shared sense amplifier, is disposed.

9. The dynamic semiconductor memory device in claim 1 wherein a capacitor plate layer, which is connected commonly to one ends of multiple cell capacitors of a memory cell group, is used as the wiring layer of the wiring that supplies a bit line precharge potential commonly to one or a multiple of said equalizer circuits on one side and one or a multiple of said equalizer circuits on the other side from said current-limiting element.

10. The dynamic semiconductor memory device in claim 2 wherein a capacitor plate layer, which is connected commonly to one ends of multiple cell capacitors of a memory cell group, is used as the wiring layer of the wiring that supplies a bit line precharge potential commonly to one or a multiple of said equalizer circuits on one side and one or a multiple of said equalizer circuits on the other side from said current-limiting element.

11. The dynamic semiconductor memory device in claim 1 comprising means for variably switch-controlling the limit current level of said current-limiting element.

12. The dynamic semiconductor memory device in claim 2 comprising means for variably switch-controlling the limit current level of said current-limiting element.

13. The dynamic semiconductor memory device in claim 3 comprising means for switching to a voltage selected from a reference voltage, the substrate voltage of a memory cell transistor, and the standby voltage of a word line as the voltage supplied to the gate of a PMOS transistor constituting said current-limiting element.

14. The dynamic semiconductor memory device in claim 4 comprising means for switching to a voltage selected from a reference voltage, the substrate voltage of a memory cell transistor, and the standby voltage of a word line as the voltage supplied to the gate of a PMOS transistor constituting said current-limiting element.

15. The dynamic semiconductor memory device as defined in claim 11 wherein the limit current level of said current-limiting element is switched based on the test mode.

16. The dynamic semiconductor memory device as defined in claim 12 wherein the limit current level of said current-limiting element is switched based on the test mode.

17. The dynamic semiconductor memory device as defined in claim 9 wherein a fuse that variably controls the limit current level of said current-limiting element based on whether it is cut or not is provided, and the limit current level of said current-limiting element is switched by cutting a fuse.

18. The dynamic semiconductor memory device as defined in claim 10 wherein a fuse that variably controls the limit current level of said current-limiting element based on whether it is cut or not is provided, and the limit current level of said current-limiting element is switched by cutting a fuse.

19. A dynamic semiconductor memory device comprising:

two memory arrays, each having redundant cells, oppositely disposed on one side and the other side and;

a sense amplifier circuit connected in between said two memory arrays and wherein;

said sense amplifier circuit comprises;

an equalizer circuit on one side having two active elements, provided for a bit line pair of said memory array on one side, one end of which is connected to each of said bit line pair, and driving each of said bit line pair to a bit precharge voltage during a precharge equalizing operation according to a bit precharge voltage inputted into the other end, and one active element inserted in between said bit line pair, and wherein the control terminals of said three active elements are connected in common to a first equalizer control signal;

an equalizer circuit on the other side having two active elements, provided for a bit line pair of said memory array on the other side, one end of which is connected to each of said bit line pair, and driving each of said bit line pair to a bit precharge voltage during a precharge equalizing operation according to a bit precharge voltage inputted into the other end, and one active element inserted in between said bit line pair, and wherein the control terminals of said three active elements are connected in common to a second equalizer control signal;

a sense circuit receiving a voltage of a bit line pair at a first and second nodes, differentially amplifying and outputting it to said first and second nodes;

a first switch performing on/off control of a connection between ends of a bit line pair connected to said equalizer circuit on one side and the first and second nodes of said sense circuit based on an inputted control signal;

a second switch performing on/off control of a connection between ends of a bit line pair connected to said equalizer circuit on the other side and the first and second nodes of said sense circuit based on an inputted control signal and;

a switch performing on/off control of an IO line that corresponds to the fist and second nodes of said sense circuit based on an inputted column selecting signal, and;

a current-limiting element, provided commonly for a pair of said equalizer circuit on one side and the other side, whose one end is connected to a bit line precharge power supply, into whose control terminal a prescribed voltage is inputted, whose other end is commonly connected to said other end of two active elements driving said bit line pair to a bit precharge voltage, is provided, wherein said memory cell group on one side and said memory cell group on the other side are assigned to different units in terms of a unit of memory cell group, connected to each of said equalizer circuit on one side and said equalizer circuit on the other side, sharing said one current-limiting element, that is to be replaced by the same group in column redundancy termed "column replacement segment" hereafter.

20. The dynamic semiconductor memory device as defined in claim 19 wherein;

said current-limiting element is provided commonly for said multiple equalizer circuits on one side and multiple said equalizer circuits on the other side and;

one end of said current-limiting element is connected to a bit line precharge power supply, a prescribed voltage is inputted into a control terminal, the other end is commonly connected to said other end of two active elements driving said bit line pair to a bit precharge potential in said multiple equalizer circuits on one side, and is commonly connected to said other end of two active elements driving said bit line pair to a bit precharge voltage in said multiple equalizer circuits on the other side.

21. The dynamic semiconductor memory device as defined in claim 20 wherein the data of a bit line pair connected to said multiple equalizer circuits on one side and a bit line pair connected to said multiple equalizer circuits on the other side is connected to an IO line that corresponds through a switch turned on/off by a common column selecting signal.

* * * * *